(12) United States Patent
Lu et al.

(10) Patent No.: US 12,317,654 B2
(45) Date of Patent: May 27, 2025

(54) LIGHT-EMITTING DEVICE AND MANUFACTURING METHOD THEREOF

(71) Applicant: Epistar Corporation, Hsinchu (TW)

(72) Inventors: Tsung-Hong Lu, Hsinchu (TW); Ching-Tai Cheng, Hsinchu (TW)

(73) Assignee: Epistar Corporation, Hsinchu (TW)

(*) Notice: Subject to any disclaimer, the term of this patent is extended or adjusted under 35 U.S.C. 154(b) by 25 days.

(21) Appl. No.: 17/850,549

(22) Filed: Jun. 27, 2022

(65) Prior Publication Data
US 2022/0328734 A1 Oct. 13, 2022

Related U.S. Application Data

(63) Continuation of application No. 16/674,463, filed on Nov. 5, 2019, now Pat. No. 11,374,154.

(30) Foreign Application Priority Data

Nov. 6, 2018 (TW) .................. 107139285

(51) Int. Cl.
| | |
|---|---|
| *H01L 33/00* | (2010.01) |
| *H01L 33/08* | (2010.01) |
| *H01L 33/50* | (2010.01) |
| *H10H 20/851* | (2025.01) |
| *H10H 20/856* | (2025.01) |
| *H10H 20/01* | (2025.01) |

(52) U.S. Cl.
CPC ...... *H10H 20/8515* (2025.01); *H10H 20/856* (2025.01); *H10H 20/0361* (2025.01); *H10H 20/0363* (2025.01)

(58) Field of Classification Search
CPC . H01L 33/60; H01L 2933/005; H01L 33/502; H01L 33/486; H01L 33/56; H01L 33/50
See application file for complete search history.

(56) References Cited

U.S. PATENT DOCUMENTS

| | | |
|---|---|---|
| 9,799,799 B2 | 10/2017 | Hashimoto |
| 10,727,386 B2 | 7/2020 | Grotsch |
| 2013/0099212 A1 | 4/2013 | Jang et al. |
| 2014/0117396 A1 | 5/2014 | Eisert et al. |

(Continued)

FOREIGN PATENT DOCUMENTS

TW 201810722 A 3/2018

*Primary Examiner* — Kyoung Lee
*Assistant Examiner* — David J Goodwin
(74) *Attorney, Agent, or Firm* — MUNCY, GEISSLER, OLDS & LOWE. P.C.

(57) ABSTRACT

A light-emitting device comprises a light-emitting element, a covering structure, a quantum dot material block, and an adhesive structure is disclosed. The covering structure has a depressed part. The quantum dot material block is filled into the depressed part and enclosed by the light-emitting element and the covering structure. The light-emitting element, the covering structure, and the quantum dot material block are bonded together through the adhesive structure. Since the quantum dot material block is enclosed by the covering structure and the light-emitting element, the outer moisture and oxygen are blocked by the covering structure and the light-emitting element from the quantum dot material block, the decreasing emitting efficiency of the quantum dot material is further alleviated.

14 Claims, 5 Drawing Sheets

(56) References Cited

U.S. PATENT DOCUMENTS

| | | |
|---|---|---|
| 2015/0340547 A1 | 11/2015 | Tamaki |
| 2015/0364639 A1 | 12/2015 | Hong et al. |
| 2016/0043289 A1* | 2/2016 | Inomata ............... H01L 33/505 |
| | | 252/301.4 R |
| 2017/0244010 A1* | 8/2017 | Kim ....................... G02B 5/208 |
| 2017/0256674 A1 | 9/2017 | Hashimoto |
| 2018/0198031 A1* | 7/2018 | Kim ........................ H01L 33/54 |
| 2018/0212118 A1* | 7/2018 | Chen ...................... H01L 33/56 |
| 2019/0081219 A1* | 3/2019 | Chen .................... H01L 33/504 |
| 2019/0165218 A1 | 5/2019 | Nakai et al. |
| 2019/0259922 A1* | 8/2019 | Hsieh .................... H01L 33/505 |
| 2020/0161513 A1 | 5/2020 | Nishioka |

\* cited by examiner

LIGHT-EMITTING DEVICE AND MANUFACTURING METHOD THEREOF

CROSS-REFERENCE TO RELATED APPLICATION

This application is a Continuation of co-pending application Ser. No. 16/674,463, filed on Nov. 5, 2019, for which priority is claimed under 35 U.S.C. § 120; and this application claims the benefit of Taiwan Patent Application No. 107139285, filed on Nov. 6, 2018, in the Taiwan Intellectual Property Office the disclosure of which is incorporated herein by reference in its entirety.

FIELD OF THE DISCLOSURE

The present disclosure relates to a light-emitting device, and more particularly to a package structure having a quantum dot material and a manufacturing method thereof.

BACKGROUND OF THE DISCLOSURE

A light-emitting diode has properties such as low electricity consumption, low heat dissipation, long operating life, good shockproof, small volume, and quick response time, so that it is widely used for different kinds of areas that need light-emitting devices, for example, cars, household appliances, and illuminating lamps. A wavelength conversion material, for instance, a phosphor, is a photoluminescence substance. The foregoing wavelength conversion material may absorb a first light emitted from the light-emitting diode then emits a second light with a different spectrum from that of the first light. Forming the wavelength conversion material on the light-emitting diode may form a light-emitting device.

In recent years, to meet the demand of the public regarding the image quality of display, wide color gamut technology development has become one of the important topics to displays nowadays. The standard of wide color gamut is provided by National Television System Committee, NTSC. Generally speaking, if a display adopts the phosphor, its color gamut can reach 70~80% of NTSC standard. If a display adopts the quantum dot (QD) material, its color gamut can reach 100% of NTSC standard, which is more qualified as the wide color gamut.

FIG. 1 shows a conventional chip scale package (CSP) structure of the light-emitting device. The light-emitting device includes a light-emitting element 1, for example, an LED. Two electrodes 2 are set at the bottom surface of the light-emitting element 1. An adhesive 3 covers the surface of the light-emitting element 1. The adhesive 3 is generally a phosphor mixed with Si resin. The foregoing phosphor may be replaced by the quantum dot to achieve a higher NTSC standard. An issue about decreasing emitting efficiency of the chip scale package is caused since the properties of the quantum dot are easily affected by the moisture and oxygen, and the Si resin is easily penetrated by the moisture and Oxygen as well. For the forgoing issues, to improve the package of the quantum dot and efficiently stop the moisture and oxygen penetration has become an urgent goal for the industry nowadays.

SUMMARY OF THE DISCLOSURE

A main purpose for the present disclosure is to provide a light-emitting device and a manufacturing method thereof. The manufacturing method is about sealing a quantum dot material (QD material) within the package structure constituted by a light-emitting element and a covering structure having a depressed part. By means of the covering structure and the light-emitting element, the moisture and oxygen are blocked by the covering structure and the light-emitting element from the quantum dot material, which further avoids affecting the emitting efficiency of the quantum dot material due to the erosion of the moisture and oxygen.

For achieving the foregoing purpose, the light-emitting device is disclosed by the present disclosure. The light-emitting device comprises a light-emitting element, a covering structure, a quantum dot material block, and an adhesive structure. The covering structure has a depressed part. The quantum dot material block is filled into the depressed part and enclosed by the light-emitting element and the covering structure. The light-emitting element, the covering structure, and the quantum dot material block are bonded together through the adhesive structure.

BRIEF DESCRIPTION OF THE DRAWINGS

The structure and the technical means adopted by the present disclosure to achieve the above and other objects can be best understood by referring to the following detailed description of the embodiments and the accompanying drawings, wherein.

DETAILED DESCRIPTION OF THE EMBODIMENTS

The detailed description of the chip scale package having quantum dot and the manufacturing method thereof are described below. Many different embodiments or examples will be carried out by the following description. The specific elements and arrangement described below are simply for describing, but not for limiting the scope and the spirit of the present disclosure.

Figure 1:
FIG. 1 is the cross-sectional view of a conventional chip scale package structure of the light-emitting device.
Figure 2A:
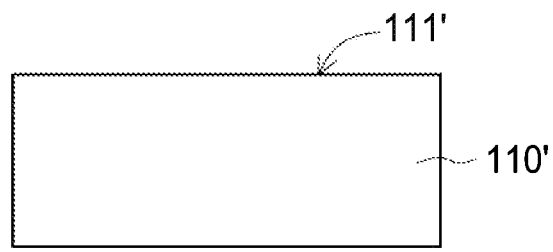
FIGS. 2A-2G describe the manufacturing process of the light-emitting device in accordance with one embodiment of the present disclosure.

FIGS. 2A to 2G show the side views of manufacturing process of the light-emitting device in accordance with one embodiment of the present disclosure. The manufacturing process includes:

Step 1 is shown in FIG. 2A. A transparent block 110' having a plane 111' is provided. In one embodiment, the transparent block 110' can be made of inorganic material. In one embodiment, the transparent block 110' can be made of glass.

Figure 2B:
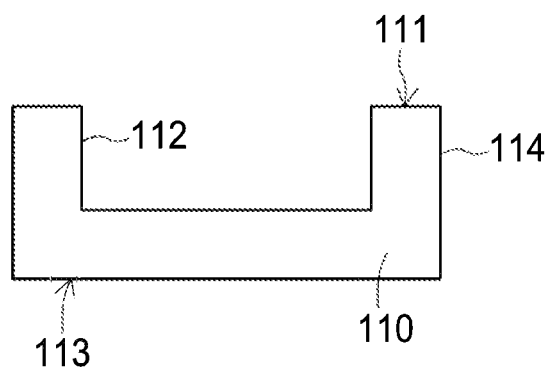

Step 2 is shown in FIG. 2B. A part of the plane 111' of the transparent block 110' is removed from an appropriate position to form a covering structure 110 with a depressed part 112. The covering structure 110 comprises a first top surface 111, a first bottom surface 113, and an outer side surface 114 located between the first top surface 111 and the first bottom surface 113. The foregoing covering structure 110 can be sealing glass. In one embodiment, the depressed part 112 is formed by wet etching or dry etching. The dry etching is performed by laser, for example. In another embodiment, the covering structure 110 is formed by molding with transparent inorganic material.

Figure 2C:
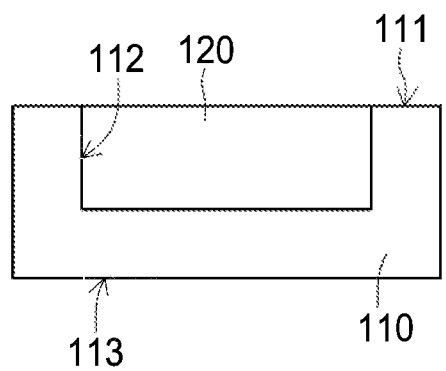

Step 3 is shown in FIG. 2C. A quantum dot material block 120 is provided and filled into the depressed part 112 of the covering structure 110. In this embodiment, the depth of the depressed part 112 must be larger than or almost equal to thickness of the quantum dot material block 120. In one embodiment, the quantum dot material block 120 comprises an adhesive (not shown in FIG. 2C) and quantum dot particles dispersing in the adhesive (not shown in FIG. 2C). The quantum dot material block 120 is filled into the depressed part 112 by methods like spraying or dispensing, with using a mask optionally.

Figure 2D:
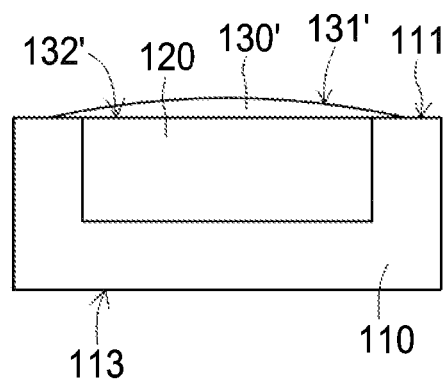

Step 4 is shown in FIG. 2D. An adhesive 130' is provided and formed above the covering structure 110 and the quantum dot material block 120. In one embodiment, the adhesive 130' is formed above the covering structure 110 and the quantum dot material block 120 by dispersing method. In one embodiment, the adhesive 130' has a second top surface 131' and a second bottom surface 132'. The second bottom surface 132' of the adhesive 130' is bonded to the first top surface 111 of the covering structure 110 and the quantum dot material block 120. The adhesive 130' is preferably with good heat resistance and high light transmittance. In one embodiment, the adhesive 130' can be made of a thermosetting resin or a light-cured resin, for instance, a silicone resin.

Figure 2E:
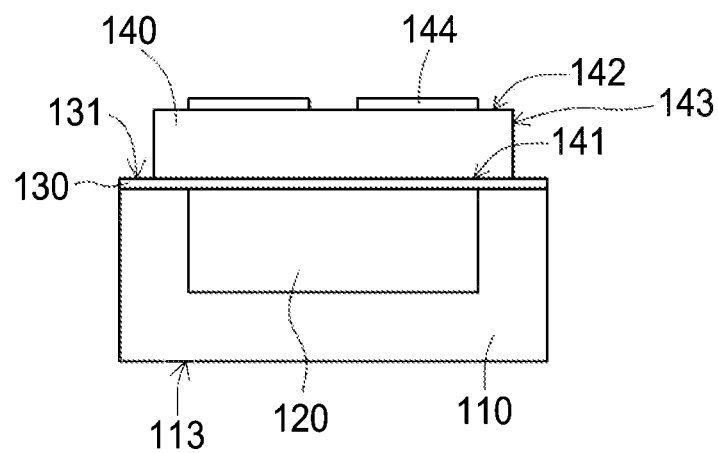

Step 5 is shown in FIG. 2E. A light-emitting device 140 having a light-emitting surface 141, an exposed surface 142, and a side surface 143 is provided. The light-emitting surface 141 of the light-emitting element 140 is bonded to the second top surface 131' of the adhesive 130' for bonding the light-emitting element 140, the covering structure 110 and the quantum dot material block 120 together. After bonding, the adhesive 130' is cured to form the adhesive structure 130. A plurality of electrodes 144 is arranged at the exposed surface 142. The plurality of electrodes 144 is electrically connected to a substrate (not shown in FIG. 2F).

Figure 2F:
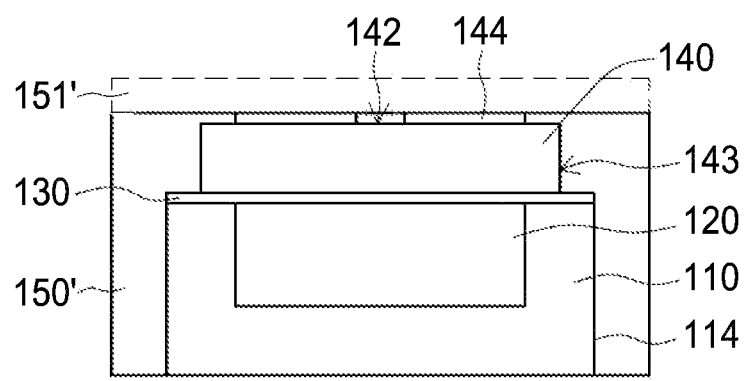

Step 6 is shown in FIG. 2F. A light-reflecting adhesive 150' is provided and covers the covering structure 110, the adhesive structure 130, and the light-emitting element 140. In one embodiment, the light-reflecting adhesive 150' covers outer side surface 114 of the covering structure 110 and the side surface 143 of the light-emitting element 140. After covering, the light-reflecting adhesive 150' is cured, and a partial light-reflecting adhesive 151' is removed for forming a light-reflecting adhesive structure. In one embodiment, the partial light-reflecting adhesive 151' is removed by grinding or deflashing. The light-reflecting adhesive structure surrounds the covering structure 110, the adhesive structure 130, the light-emitting element 140, and the sides of the electrodes 144 of the light-emitting element 140. The top surfaces of the electrodes 144 are exposed from the light-reflecting adhesive structure.

Figure 2G:
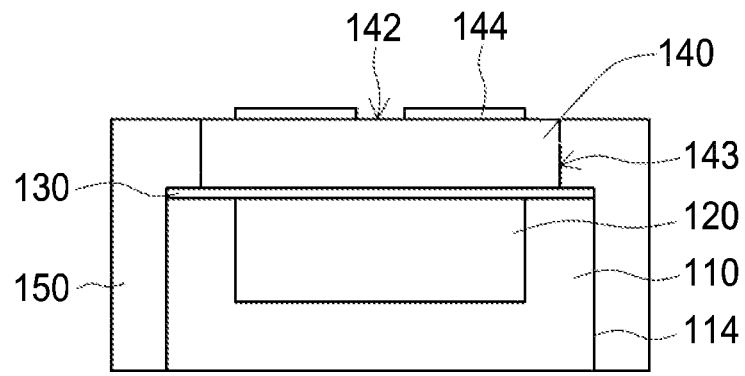

Referring to FIG. 2G, in another embodiment, the light-reflecting adhesive 150' covers the covering structure 110, the adhesive structure 130, and the sides of the light-emitting element 140 precisely and is cured to form a light-reflecting adhesive structure 150 and then a light-emitting device. In this embodiment, the exposed surface 142 is not covered by the light-reflecting adhesive structure 150.

Figure 3:
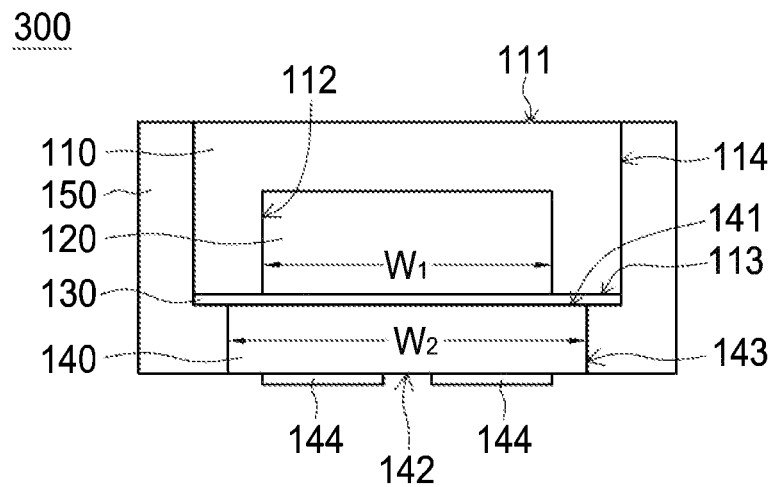
FIG. 3 shows the cross-sectional view of the light-emitting unit in accordance with one embodiment of the present disclosure.
Figure 4:
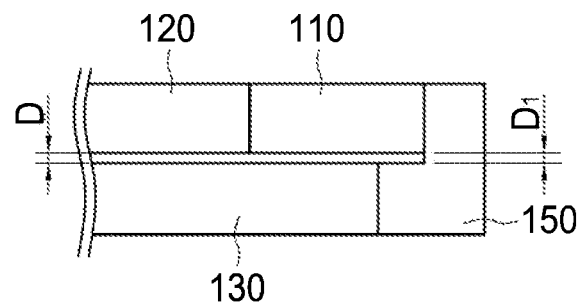
FIG. 4 shows cross-sectional view of partially enlarged area of the light-emitting device in accordance with one embodiment of the present disclosure.

FIG. 3 shows the cross-sectional view of the light-emitting device 300 in accordance with one embodiment of the present disclosure shown in FIGS. 2A-2G. FIG. 4 shows cross-sectional view of a partially enlarged area of the light-emitting device 300 in accordance with one embodiment of the present disclosure. A light-emitting device 300 comprises the covering structure 110, the quantum dot material block 120, the adhesive structure 130, the light-emitting element 140, and the light-reflecting adhesive structure 150. In one embodiment, the covering structure 110 is with the depressed part 112. The covering structure 110 comprises the outer side surface 114 located between the first top surface 111 and the bottom surface 113. The quantum dot material block 120 is filled into the depressed part 112. In one embodiment, the depressed part 112 of the covering structure 110 has a first width W1 and the light-emitting element 140 has a second width W2. The second width W2 of the light-emitting element 140 is larger than the first width W1 of the depressed part 112, which increases the paths for outer moisture and oxygen to contact the quantum dot material block 120, and decreases the opportunities for outer moisture and oxygen to contact with the quantum dot particles. As a result, the reliability of the quantum dot material block 120 is improved. One surface (first surface) of the adhesive structure 130 connects to the bottom surface 113 of the covering structure 110, and another surface (second surface) of the adhesive structure 130 connects to the light-emitting element 140. In other words, the adhesive structure 130 contacts the covering structure 110, the quantum dot material block 120 and the light-emitting element 140 directly. In one embodiment, the other surface of the adhesive structure 130 further connects the surface of the light-reflecting adhesive structure 150. Since the quantum dot material block 120 and the covering structure 110 are arranged above the light-emitting element 140 through the adhesive structure 130, there are gaps between the quantum dot material block 120 and the light-emitting element 140, as well as between the covering structure 110 and the light-emitting element 140. In one embodiment, there is a first gap D between the quantum dot material block 120 and the light-emitting element 140, and a second gap D1 between the covering structure 110 and the light-emitting element 140, while both are preferred to be as small as possible to avoid the light-emitting efficiency of the quantum dot material block 120 from being decreased, which is caused by outer moisture and oxygen passing through the first gap D and the second gap D1. In one embodiment, the first gap D and the second gap D1 are both smaller than 20 µm, in other words, the thickness of the adhesive structure 130 is smaller than 20 µm.

In one embodiment, the covering structure 110 is made of a transparent inorganic material, for example, glass or ceramics. The quantum dot material block 120 comprises an adhesive (not shown in FIG. 3) and quantum dot particles dispersing in the adhesive (not shown in FIG. 3). The adhesive can be made of a thermosetting resin or a light-cured resin, for instance, an epoxy resin or a silicone resin. The quantum dot particles can be made of semiconductor material. The particle size of each of the quantum dot particles is smaller than 100 nm. The foregoing semiconductor material comprises II-VI group compound semiconductor, III-V group compound semiconductor, IV-VI group compound semiconductor, or a combination that includes foregoing semiconductor materials. A structure of each of the quantum dot particles can comprise a core mainly for light-emitting and a shell which covers the core. The core can be made of a material composed by ZnS, ZnSe, ZnTe, ZnO, CsPbCl3, CsPbBr3, CsPbI3, CdS, CdSe, CdTe, GaN, GaP, GaSe, GaSb, GaAs, AlN, AlP, AlAs, InP, InAs, Te, PbS, InSb, PbTe, PbSe, SbTe, ZnCdSe, ZnCdSeS, or CuInS. The material of the shell has to be matched to the material of the core, for instance, the lattice constant of the material of the shell has to be matched to that of the core. To be more specific, not only the lattice constant of the material of the shell has to be matched to that of the core, but also a high energy barrier area needs to be formed along the periphery of the core for improving the quantum yield. A structure of the shell can be a single layer structure, a multilayer structure, or a composition gradient structure made of various materials. In one embodiment, the core is CdSe, and the shell is a single layer of ZnS. In another embodiment, the core is CdSe, and the shell comprises an inner layer of (Cd, Zn) (S, Se) and an outer layer of ZnS. In another embodiment, the core is CdSe, and the shell comprises an inner layer of CdS, a middle composition gradient structure of $Zn_{0.25}Cd_{0.75}S/Zn_{0.5}Cd_{0.5}S/Zn_{0.75}Cd_{0.25}S$, and an outer layer of ZnS.

FIG. 3 shows the light-emitting device 300 in accordance with one embodiment of the present disclosure. The light-emitting device 300 includes a light-emitting element 140 having the light-emitting surface 141, the exposed surface 142 parallel to the light-emitting surface 141, and the side surface 143. A plurality of electrodes 144 is arranged at the exposed surface 142 of the light-emitting element 140. The light-reflecting adhesive structure 150 covers the outer side surface 114 of the covering structure 110 and the side surface 143 of the light-emitting element 140. In one embodiment, the light-reflecting adhesive structure 150 surrounds the covering structure 110 and the light-emitting element 140.

In one embodiment, the light-emitting element 140 includes a carrier (not shown in FIG. 3), a light-emitting laminated structure (not shown in FIG. 3), and a plurality of electrodes 144. In one embodiment, the carrier is a growth substrate for epitaxially growing the light-emitting laminated structure. In the embodiment, the growth substrate can be a sapphire substrate. In another embodiment, the carrier is not a growth substrate. While manufacturing the light-emitting element 140, the carrier is removed and replaced by other substrate (for instance, other substrate with different material, different structure, or different shape). In one embodiment, for reducing the heat from the light-emitting element 140 being transferred to the quantum dot material block 120, the carrier is made of a material with low heat transfer coefficient. The foregoing material can be, for example, glass or ceramics with low heat transfer coefficient. The foregoing ceramics with low heat transfer coefficient can be Zirconia. In another embodiment, for effectively transferring the heat from the quantum dot material block 120 through the light-emitting element 140, the carrier is made of a material with high heat transfer coefficient. The foregoing material can be ceramics with high heat transfer coefficient. The foregoing ceramics with high heat transfer coefficient can be AlO or AlN. Although light-emitting laminated structure is not shown in FIG. 3, the light-emitting laminated structure actually includes a plurality of semiconductor layers. For example, the light-emitting laminated structure sequentially includes a first type semiconductor layer, a light-emitting laminated layer, and a second type semiconductor layer, wherein the light-emitting laminated layer is between the first type semiconductor layer and the second type semiconductor layer. When the foregoing first type semiconductor layer is an n type semiconductor layer, the foregoing second type semiconductor layer is a p type semiconductor layer. When the foregoing first type semiconductor layer is a p type semiconductor layer, the foregoing second type semiconductor layer is an n type semiconductor layer. In one embodiment, each of the plurality of electrodes 144 is at the same side of the light-emitting element 140 to electrically connect the light-emitting element 140 the external environment. A combination of light-reflecting adhesive structure 150 comprises a resin and reflecting particles dispersed in the resin. The foregoing reflecting particles can be TiO, ZnO, AlO, $BaSO_4$, or $CaCO_3$. In one embodiment, the resin is Si resin and the reflecting particles are TiO.

The light-emitting device 300 in accordance with one embodiment of the present disclosure has the quantum dot material block 120 filled into the depressed part 112 of the covering structure 110, so that the quantum dot material 120 is covered by the depressed part 112, and the covering structure 110 is bonded with the light-emitting element 140, wherein no material of the covering structure 110 exists between the covering structure 110 and the light-emitting surface 141 of the light-emitting element 140, nor between the quantum dot material block 120 and the light-emitting surface 141 of the light-emitting element 140. Still, the quantum dot material block 120 is enclosed by the covering structure 110 and the light-emitting element 140. Accordingly, the outer moisture and oxygen are blocked by the covering structure 110 and the light-emitting element 140 from the quantum dot material block 120. The outer moisture and oxygen need to pass through the covering structure 110 and the light-emitting element 140 before contacting the quantum dot material block 120. Because the second width W2 of the light-emitting element 140 is larger than the first width W1 of the depressed part 112, the depressed part 112 is all covered by the light-emitting element 140, which further avoids the outer moisture and oxygen from passing the light-emitting element 140 and directly contacting with the quantum dot material block 120. In other words, the decrease of the light-emitting efficiency of the quantum dot material block 120 caused by the outer moisture and oxygen can be alleviated because the covering structure 110 and the light-emitting element 140 of the light-emitting device 300 of the present disclosure have the ability to block the outer moisture and oxygen.

Figure 5:
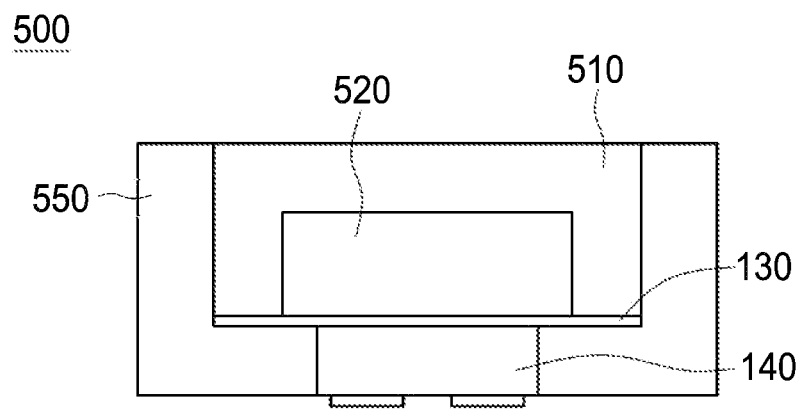
FIG. 5 shows the cross-sectional view of the light-emitting device in accordance with one comparative example to the present disclosure.

FIG. 5 shows the cross-sectional view of the light-emitting device 500 in accordance with one comparative example to the present disclosure. The light-emitting device 500 includes a covering structure 510, a quantum dot material block 520, an adhesive structure 130, a light-emitting element 140, and a light-reflecting adhesive structure 550. One difference between the light-emitting device 500 and the light-emitting device 300 disclosed in FIGS. 2A-2G is the second width W2 (not shown in FIG. 5) of the light-emitting element 140 is smaller than the first width W1 (not shown in FIG. 5) of the depressed part 112.

Figure 6:
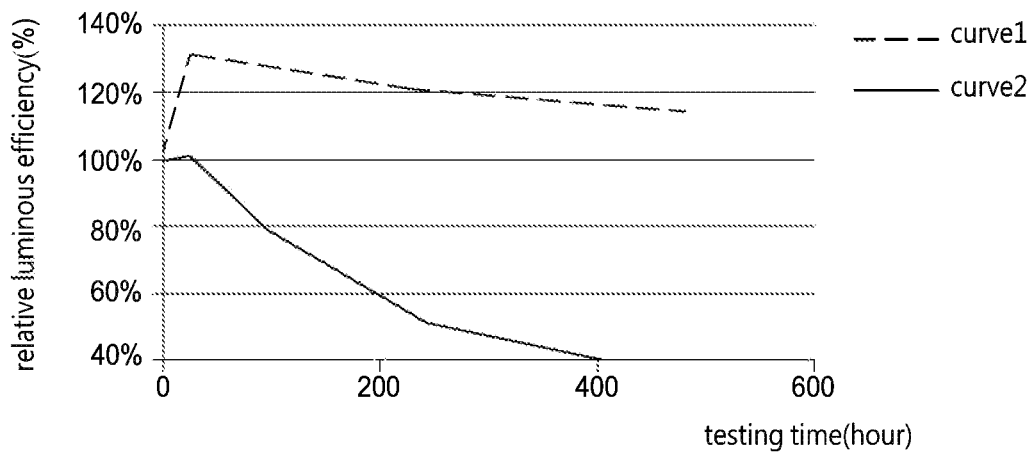
FIG. 6 shows the luminous efficiencies at different test timings to the light-emitting device in accordance with one embodiment of the present disclosure and a comparative embodiment of the light-emitting device.

FIG. 6 shows the relative luminous efficiencies at different test timings of the light-emitting device 300 and the light-emitting device 500, respectively. The luminous efficiency of the light-emitting device is defined as 100% relative luminous efficiency when the light-emitting device starts to emit (zero hour). In the light-emitting devices 300 and 500, the first gap D between the quantum dot material and the light-emitting device and the second gap D1 between the covering structure and the light-emitting device are both smaller than 20 μm. The operating condition is under room temperature 25° C., the electric current is 20 mA.

FIG. 6 shows that after passing 480 testing hours, the relative luminous efficiency of the light-emitting device 300 still achieves 125%. That data demonstrates the decrease of the light-emitting efficiency of the quantum dot material 120 block can be alleviated because when the quantum dot material block 120 fills the depressed part 112 of the covering structure 110 and bonds with the light-emitting element 140 by the adhesive structure 130, the outer moisture and oxygen are blocked by the covering structure 110 and the light-emitting element 140.

FIG. 6 also shows the relative luminous efficiency of the light-emitting device 500. After passing 400 testing hours, the relative luminous efficiency of the light-emitting device 500 decreases extremely. The luminous performance declines from 100% relative luminous efficiency to 50% relative luminous efficiency, which demonstrates that the decrease of light-emitting efficiency of the quantum dot material block 120 can be alleviated significantly when the second width W2 of the light-emitting element 140 is larger than the first width W1 of the depressed part 112 of the light-emitting device 300 shown in FIG. 3.

Figure 7A:
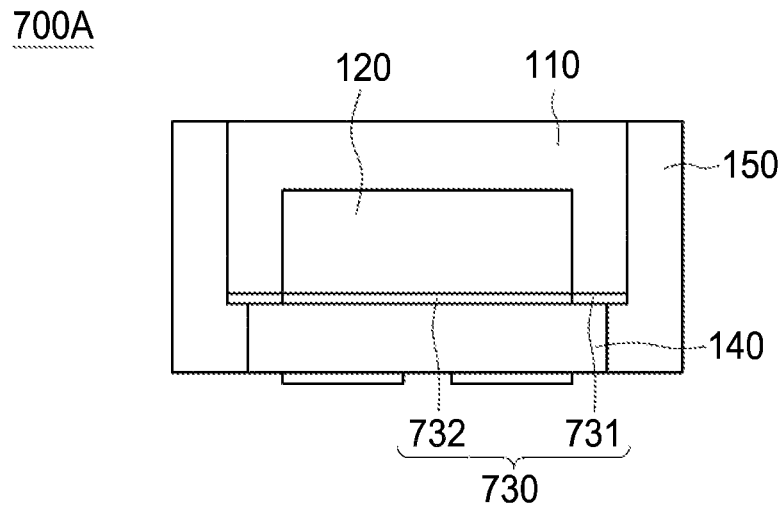
FIG. 7A shows the cross-sectional view of the light-emitting device in accordance with another embodiment of the present disclosure.
Figure 7B:
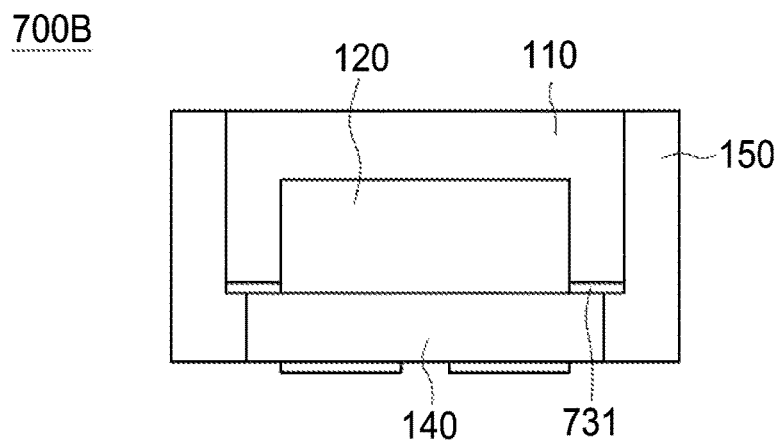
FIG. 7B shows the cross-sectional view of the light-emitting device in accordance with another embodiment of the present disclosure.

FIG. 7A shows the cross-sectional view of the light-emitting device 700A in accordance with another embodiment of the present disclosure. A light-emitting device 700A comprises the covering structure 110, the quantum dot material block 120, the adhesive structure 730, the light-emitting element 140, and the light-reflecting adhesive structure 150. The difference between the light-emitting device 700A and the light-emitting device 300 is the adhesive structure 730 includes a non-transparent adhesive portion 731 and a transparent adhesive portion 732. The non-transparent adhesive portion 731 is located between the covering structure 110 and the light-emitting element 140, but not between the quantum dot material block 120 and the light-emitting element 140. The non-transparent adhesive portion 731 bonded the surface of the covering structure 110 and the surface of light-emitting element 140. In addition, the quantum dot material block 120 is enclosed by the covering structure 110 and the light-emitting element 140. In this embodiment, the material of the non-transparent adhesive portion 731 can be made of metal or alloy. The foregoing metal can be Au. The foregoing alloy can be SAC alloy or Au—Sn alloy. In this embodiment, at least one non-transparent adhesive portion 731 is located between the covering structure 110 and the light-emitting element 140. In one embodiment, the light-emitting element 140 is a blue light-emitting diode. The blue light emitted from the light-emitting element 140 does not pass through the covering structure 110 laterally since the blue light is blocked by the non-transparent adhesive portion 731, which results in non-uniform light color between the top and the side of the light-emitting device 700A. Besides, high air tightness is produced when the covering structure 110 combines with the light-emitting element 140 since the non-transparent adhesive portion 731 is made of metal. Therefore, the covering structure 110 and the light-emitting element 140 can avoid the outer moisture and oxygen. The transparent adhesive portion 732 is surrounded by the non-transparent adhesive portion 731. The transparent adhesive portion 732 adheres the quantum dot material block 120 and the light-emitting element 140, and light emitted from the light-emitting element 140 can pass through the transparent adhesive portion 732. The material of the transparent adhesive portion 732 can be the same with or similar to the material of the adhesive structure 130. FIG. 7B shows the cross-sectional view of the light-emitting device 700B in accordance with another embodiment of the present disclosure. The difference between the light-emitting device 700B and the light-emitting device 700A is that there is no transparent adhesive portion 732 between the quantum dot material block 120 and the light-emitting element 140. In other words, the quantum dot material block 120 contacts the light-emitting element 140 directly. The brightness of the light-emitting device 700B can be improved since there is no transparent adhesive portion 732 to absorb the light from the light-emitting element 140.

Figure 8:
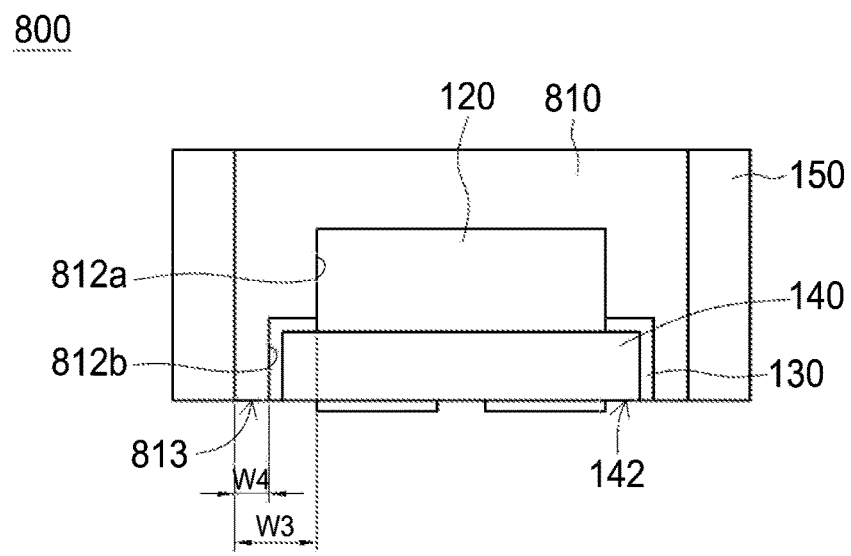
FIG. 8 shows the cross-sectional view of the light-emitting device in accordance with another embodiment of the present disclosure.

FIG. 8 shows the cross-sectional view of the light-emitting device 800 in accordance with another embodiment of the present disclosure. As FIG. 8 shows, the light-emitting device 800 comprises a covering structure 810, the quantum dot material block 120, the adhesive structure 130, the light-emitting element 140, and the light-reflecting adhesive structure 150. The difference between the light-emitting device 800 and the light-emitting device 300 is the covering structure 810 comprises a first part 812a and a second part 812b. The first part 812a is in a square ring shape having a width defined as a third width W3. The second part 812b is in a square ring shape having a width defined as a fourth width W4. The third width W3 of the first part 812a is larger than the fourth width W4 of the second part 812b. In one embodiment, the second part 812b extends vertically from the first part 812a. The first part 812a and the second part 812b integrate to each other to form a step. In one embodiment, the quantum dot material block 120 and the light-emitting element 140 are filled into the first part 812a and the second part 812b respectively. Next, the covering structure 810 and the light-emitting element 140 are bonded so that the quantum dot material block 120 is sealed between the covering structure 810 and the light-emitting element 140. As FIG. 8 shows, one part of the quantum dot material block 120 is arranged inside the first part, 812a and the remaining part of the quantum dot material block 120, the adhesive structure 130 and the light-emitting element 140 are arranged inside the second part 812b, also the quantum dot material block 120 contacts to the light-emitting element 140, and the adhesive structure 130 surrounds outer side of the remaining part of the quantum dot material block arranged inside the second part 812b and outer side of the light-emitting element 140. The quantum dot material block 120 and the light-emitting element 140 are fully filled into the depressed part 812a and the second part 812b. In addition, the exposed surface 142 of the light-emitting element 140 parallel to an interface between the light-emitting element 140 and the quantum dot material block 120, and away from the quantum dot material block 120 and the exposed surface 813 of the covering structure 810 parallel to an interface between the light-emitting element 140 and the quantum dot material block 120, and away from the quantum dot material block 120 are approximately flush with each other. As a result, the quantum dot material block 120 is pasted to the light-emitting element 140 during the bonding process of the light-emitting element 140 and the covering structure 810. Besides, in this embodiment, because the exposed surface 142 of the light-emitting element 140 does not protrude from the exposed surface 813 of the covering structure 810, it indicates there are no gaps between the quantum dot material block 120 and the light-emitting element 140, and between the covering structure 810 and the light-emitting element 140. Accordingly, the outer moisture and oxygen need to pass through the covering structure 810 and the light-emitting element 140 before reaching the quantum dot material block 120. In addition, because the width of the light-emitting element 140 is larger than that of the first part 812a, the first part 812a is blocked by the light-emitting element 140. Considering there is no gap between the quantum dot material block 120 and the light-emitting element 140, it is difficult for the outer moisture and oxygen to enter the light-emitting device 800, and the decrease of the light-emitting efficiency of the quantum dot material 120 caused by the outer moisture and oxygen can be alleviated. The material and the manufacturing method of the covering structure 810 are the same with or similar to that of the covering structure 110, and can be referred to related paragraphs that describe the covering structure 110.

Figure 9:
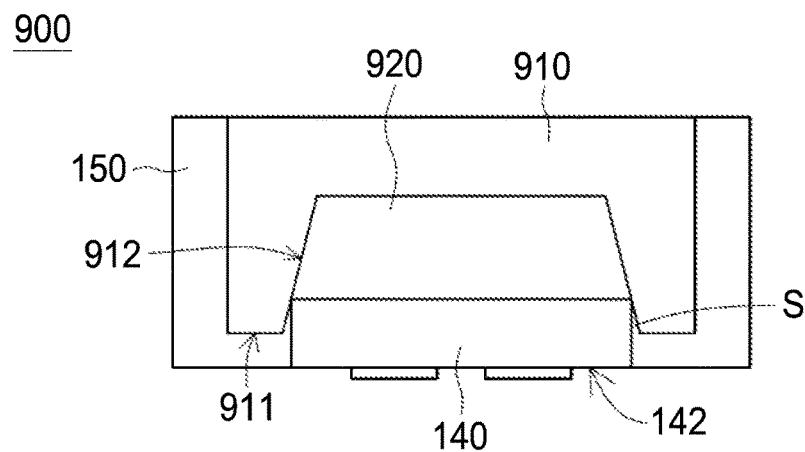
FIG. 9 shows the cross-sectional view of the light-emitting device in accordance with another embodiment of the present disclosure.

FIG. 9 shows the cross-sectional view of the light-emitting device 900 in accordance with another embodiment of the present disclosure. As FIG. 9 shows, the light-emitting device 900 comprises a covering structure 910, a quantum dot material block 920, the light-emitting element 140, and the light-reflecting adhesive structure 150. The covering structure 910 comprises a depressed part 912, the inner surface of the depressed part 912 has a slope and the depth of the depressed part 912 is larger than or approximately equal to the thickness of the quantum dot material block 920 pluses all or partial height of the light-emitting element 140. During the bonding process of the covering structure 910 and the light-emitting element 140, the quantum dot material block 920 can be surrounded and covered by the covering structure 910 and the light-emitting element 140. As FIG. 9 shows, the exposed surface 142 of the light-emitting element 140 protrudes from the bottom surface 911 of the covering structure 910 when the quantum dot material 920 and the light-emitting element 140 are arranged into the depressed part 912. Since there is a slope of two sides of the depressed part 912, a gap S is formed between one inner side of the depressed part 912 and the corresponding outer side of the light-emitting element 140. A deterioration of the quantum dot material block 920 caused by the outer moisture and oxygen penetrating into the light-emitting device 900 can be further avoided by filling the light-reflecting adhesive structure 150 into the gap S at the same time while covering the light-reflecting adhesive structure 150 over the covering structure 910 and the light-emitting element 140. In this embodiment, the quantum dot material 920 is closely attached to the light-emitting element 140 during the bonding process of the light-emitting element 140 and the covering structure 910. Besides, the bottom surface 911 of the covering structure 910, which is parallel to the interface between the light-emitting element 140 and the quantum dot material block 920 and close to the light-emitting element 140, goes beyond the interface between the light-emitting element 140 and the quantum dot material block 920, so that the light-emitting device 900 avoids the outer moisture and oxygen from penetrating into the light-emitting device 900 through the gaps between the quantum dot material block 920 and the light-emitting element 140 to penetrate into. The width of the depressed part 912 of the covering structure 910 and the width of the light-emitting element 140 can be adjusted to be equal or non-equal.

In summary, a quantum dot material block is provided and filled into the depressed part of the covering structure so that the quantum dot material block attaches to the light-emitting element. Still, the light-emitting element bonds directly with the covering structure. In addition, the width of the light-emitting element is larger than the width of the depressed part of the covering structure, and the depressed part is blocked by the light-emitting element, which further avoids the outer moisture and oxygen from passing the light-emitting element and directly contacting with the quantum dot material block. In other words, the decrease of the light-emitting efficiency of the quantum dot material caused by the outer moisture and oxygen can be alleviated because the covering structure and the light-emitting element of the light-emitting device of the present disclosure have the ability to block the outer moisture and oxygen.

The present disclosure will now be described with some embodiments thereof and it is understood that many changes and modifications in the described embodiments can be carried out without departing from the scope and the spirit of the disclosure that is intended to be limited only by the appended claims.

The invention claimed is:

1. A light-emitting device, comprising:
a light-emitting element, comprising a first bottom surface, a first top surface, a first side surface, and a first maximum width;
a quantum dot material block, completely arranged above the light-emitting element, and comprising a second bottom surface, a second top surface, a second side surface, and a second maximum width;
a covering structure, covering the second top surface and the second side surface, and comprising a third bottom surface; and
a light-reflecting adhesive structure, surrounding the quantum dot material block and the covering structure, and comprising an inner surface laterally surrounding the light-emitting element and directly connected to the first side surface of the light-emitting element from the first bottom surface to the first top surface,
wherein the second maximum width is larger than the first maximum width, and
wherein the second bottom surface and the third bottom surface are substantially coplanar with each other, and not lower than the light-emitting element.

2. The light-emitting device as claimed in claim 1, wherein the covering structure has a third maximum width larger than the second maximum width.

3. The light-emitting device as claimed in claim 1, wherein the quantum dot material block does not cover the first side surface.

4. The light-emitting device as claimed in claim 1, wherein the covering structure does not cover the first side surface.

5. The light-emitting device as claimed in claim 1, further comprising an adhesive structure located between the light-emitting element and the quantum dot material block.

6. The light-emitting device as claimed in claim 5, wherein the adhesive structure has a thickness smaller than 20 μm.

7. The light-emitting device as claimed in claim 1, wherein the covering structure is made of a transparent inorganic material.

8. The light-emitting device as claimed in claim 1, wherein the quantum dot material block comprises an adhesive and a plurality of quantum dot particles dispersing in the adhesive.

9. The light-emitting device as claimed in claim 1, wherein the covering structure contacts to the second top surface and the second side surface.

10. The light-emitting device as claimed in claim 1, wherein the covering structure has a third side surface substantially parallel to the second side surface.

11. The light-emitting device as claimed in claim 1, wherein the covering structure has a third top surface substantially parallel to the second top surface.

12. The light-emitting device as claimed in claim 1, wherein the second bottom surface has a portion exposed from the covering structure and the light-emitting element.

13. The light-emitting device as claimed in claim 1, wherein the light-emitting element comprises a pair of electrodes disposed on a same side of the light-emitting element.

14. The light-emitting device as claimed in claim 1, wherein the quantum dot material block is spaced apart from the light-emitting element by a gap which is smaller than 20 µm.

\* \* \* \* \*